(12) United States Patent
Kai

(10) Patent No.: US 6,649,428 B2
(45) Date of Patent: Nov. 18, 2003

(54) SEMICONDUCTOR CHIP, SEMICONDUCTOR INTEGRATED CIRCUIT USING THE SAME, AND METHOD OF SELECTING SEMICONDUCTOR CHIP

(75) Inventor: Mutsuaki Kai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/096,512

(22) Filed: Mar. 13, 2002

(65) Prior Publication Data

US 2003/0040131 A1 Feb. 27, 2003

(30) Foreign Application Priority Data

Aug. 10, 2001 (JP) ........................................ 2001-243949

(51) Int. Cl.$^7$ .............................................. H01L 21/66
(52) U.S. Cl. ............................................ 438/14; 438/15
(58) Field of Search ...................... 438/14–16; 365/145, 365/149

(56) References Cited

U.S. PATENT DOCUMENTS

| | | | | |
|---|---|---|---|---|
| 4,910,582 A | * | 3/1990 | Miyamoto et al. | 257/667 |
| 5,637,187 A | * | 6/1997 | Takasu et al. | 438/30 |
| RE35,807 E | * | 5/1998 | Iversen et al. | 347/564 |
| 6,094,370 A | * | 7/2000 | Takashima | 365/145 |

FOREIGN PATENT DOCUMENTS

| | | |
|---|---|---|
| JP | 5-129463 | 5/1993 |
| JP | 2001-24151 | 1/2001 |

* cited by examiner

Primary Examiner—John F. Niebling
Assistant Examiner—Olivia T Luk
(74) Attorney, Agent, or Firm—Armstrong, Westerman & Hattori, LLP.

(57) ABSTRACT

Semiconductor chips mounted in a laminated manner on a substrate and a semiconductor integrated circuit device using the semiconductor chips. A predetermined semiconductor chip is selected by chip selection signals from an external unit despite the chips having the same wiring pattern are laminated in a plural number one upon the other. The semiconductor integrated circuit device is fabricated by using such semiconductor chips. The semiconductor chip comprises a plurality of first electrode terminals arranged on a front surface maintaining a predetermined pitch to receive reference signals for producing comparison signals that are to be compared with chip selection signals in a comparator circuit to select a chip, a plurality of second electrode terminals arranged on a back surface opposed to the front surface each being deviated by one pitch from the plurality of the first electrode terminals to output the reference signals input to the first electrode terminals, and connection portions for electrically connecting the first and second electrode terminals that are deviated by the one pitch.

5 Claims, 4 Drawing Sheets

SEMICONDUCTOR CHIP, SEMICONDUCTOR INTEGRATED CIRCUIT USING THE SAME, AND METHOD OF SELECTING SEMICONDUCTOR CHIP

BACKGROUND OF THE INVENTION

1. Field of the Invention

This invention relates to semiconductor chips laminated on a substrate, a semiconductor integrated circuit device using the same, and a method of selecting a semiconductor chip.

2. Description of the Related Art

In recent years, semiconductor integrated circuits have been realized in a highly integrated form and in an SOC (system-on-chip) form. In particular, semiconductor integrated circuits have been fabricated in a multi-chip form by laminating a plurality of semiconductor chips one upon the other relying upon a chip-mounting technology. The chip-mounting method for realizing the multi-chip devices can be represented by a super-connect technology by which a plurality of electrode terminals are arranged on the surfaces of semiconductor chips, and the semiconductor chips are laminated one upon the other and are connected together through electrode terminals. Study has been forwarded to put the super-connect technology into practical use, and has been expected as technology of the next generation. For example, a plurality of semiconductor chips forming a memory circuit are laminated one upon the other relying upon the super-connect technology in order to obtain a memory of a high density and of a large storage capacity.

In general, the memory of a large storage capacity formed by using the super-connect technology has a structure in which the semiconductor chips are laminated one upon the other via bumps to form a plurality of layers, the semiconductor chips having the same wiring pattern including electrode terminals and circuit elements. When the semiconductor chips are laminated to form the plurality of layers, signals are needed for selecting a chip which is in operation to write or read the data. When the semiconductor chips that are laminated all have the same wiring pattern, however, the positions of the electrode terminals for receiving chip selection signals become all in agreement, permitting the same chip selection signal to enter into every semiconductor chip, which makes it difficult to select the chip that is in operation.

This problem can be avoided by the following two methods. According to a first method, a plurality of semiconductor chips are prepared by using a plurality of exposure masks having different circuit patterns in a step of photolithography while deviating the electrode terminals that receive the chip selection signals. These semiconductor chips are, then, laminated on a substrate via bumps, and selection signals are successively output from the substrate to the electrode terminals that receive chip selection signals of the semiconductor chips, thereby to select the chip which is in operation.

According to a second method, a plurality of semiconductor chips are prepared by forming the same wiring pattern, irradiating a portion of the wiring pattern of each of the semiconductor chips with a laser beam to form electrode terminals which are, respectively, deviated to receive chip selection signals. These semiconductor chips are laminated on the substrate via bumps, and selection signals are successively output from the substrate to the electrode terminals that receive chip selection signals of the semiconductor chips, thereby to select the chip which is in operation.

However, the first method requires a plurality of circuit designs as well as a plurality of pieces of expensive masks for exposure. Besides, an increased number of photolithography steps are required. The second method requires a step of cutting the wiring pattern by the irradiation with a laser beam. Thus, either method requires an increased number of manufacturing steps driving up the cost of production.

SUMMARY OF THE INVENTION

It is an object of this invention to provide semiconductor chips which enable a predetermined chip to be selected by chip selection signals from an external unit despite the chips are laminated in a plural number having the same wiring pattern, to provide a semiconductor integrated circuit device using the such chips and to provide a method of selecting a semiconductor chip.

The above object is accomplished by a semiconductor chip comprising a plurality of first electrode terminals arranged on a front surface maintaining a predetermined pitch to receive reference signals for producing comparison signals that are to be compared with chip selection signals in a comparator circuit to select a chip, a plurality of second electrode terminals arranged on a back surface opposed to the front surface each being deviated by one pitch from the plurality of the first electrode terminals to output the reference signals input to the first electrode terminals, and connection portions for electrically connecting the first and second electrode terminals that are deviated by one pitch.

DESCRIPTION OF THE PREFERRED EMBODIMENTS

Figure 1:
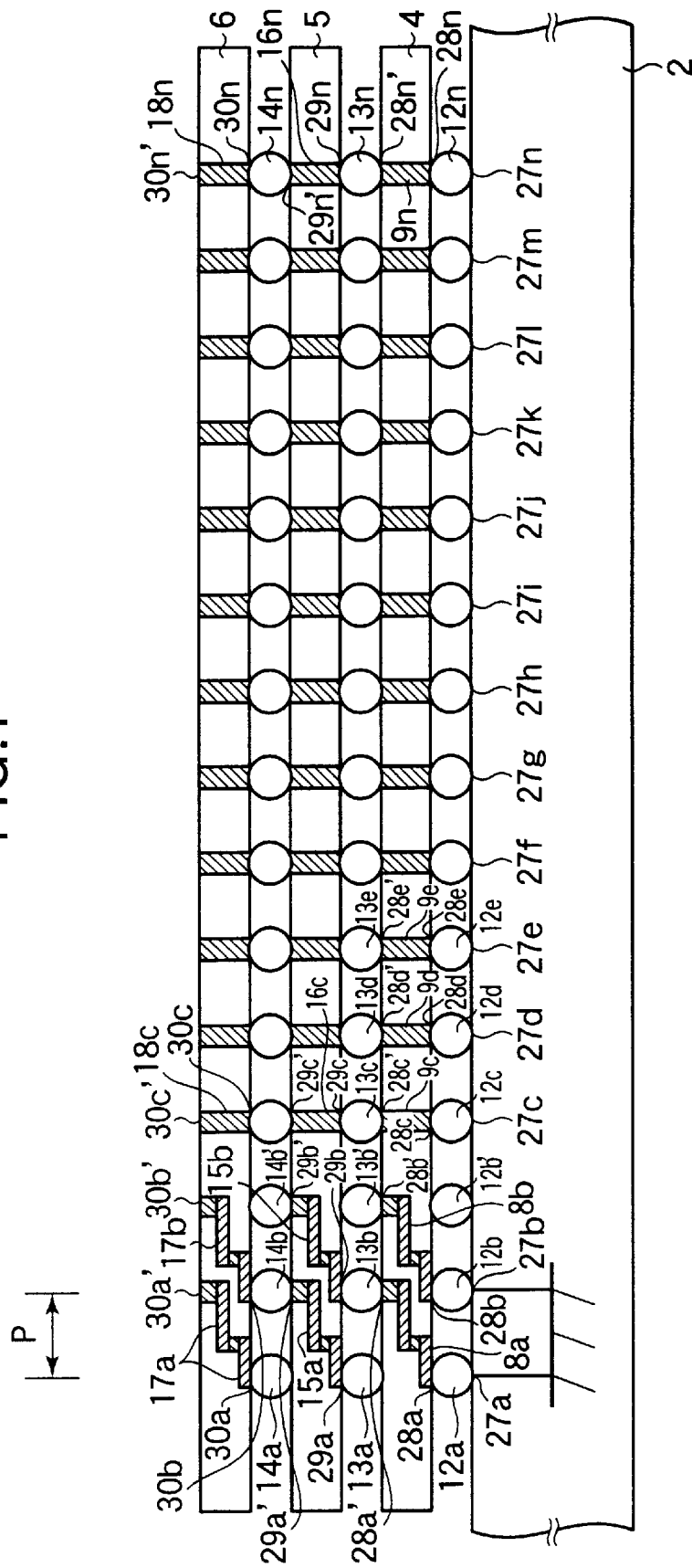
FIG. 1 is a sectional view illustrating the constitution of a semiconductor integrated circuit device according to a first embodiment of the invention.

A semiconductor chip according to a first embodiment of the invention, a semiconductor integrated circuit device using the same, and a method of selecting a semiconductor chip will now be described with reference to FIGS. 1 to 4. FIG. 1 is a sectional view schematically illustrating the constitution of a semiconductor integrated circuit device according to the embodiment. As shown in FIG. 1, for example, three semiconductor chips 4, 5 and 6 are laminated in this order on a substrate 2. The semiconductor integrated circuit device according to this embodiment is concerned with a DRAM (dynamic random access memory) having three banks constituted by semiconductor chips 4, 5 and 6. A plurality of electrode terminals are arranged like a matrix on the upper and lower surfaces of the semiconductor integrated circuit device. However, sectional views of FIG. 1 and subsequent drawings are those along a predetermined line or a row of the plurality of electrode terminals.

Figure 2:
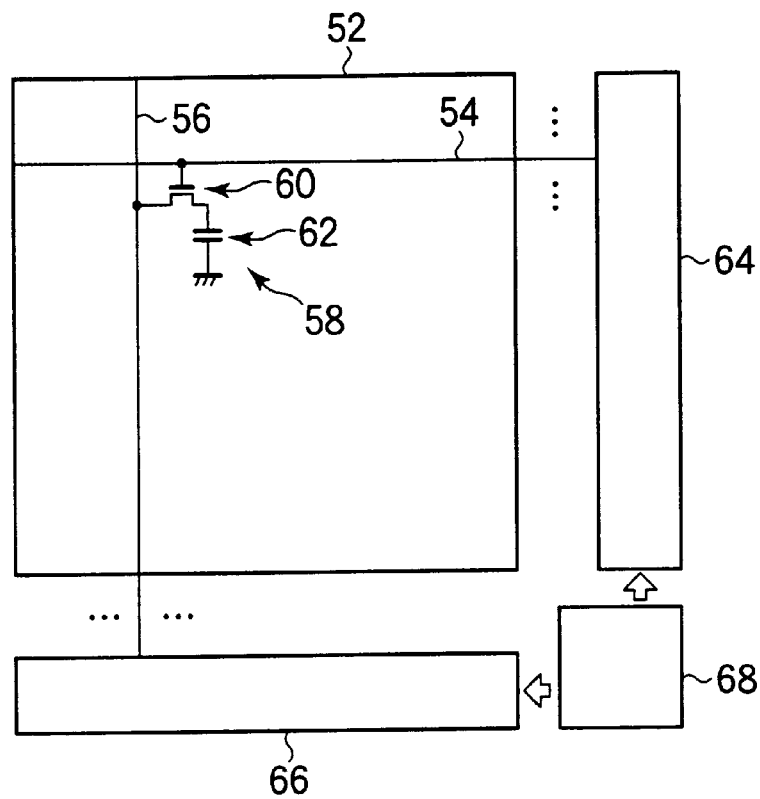
FIG. 2 is a view schematically illustrating the circuit constitution of a major portion of a semiconductor chip according to the first embodiment of the invention.

FIG. 2 is a view schematically illustrating the circuit constitution of major portions of the semiconductor chips 4, 5 and 6. As shown in FIG. 2, semiconductor chips 4, 5 and 6 each have a memory cell portion 52. In the memory cell portion 52, a plurality of memory cells 58 (only one of them is shown in FIG. 2) are formed each being constituted by a transistor 60 for transfer gate and a capacitor 62, in the form of a matrix. Among the memory cells 58, there are formed a plurality of word lines 54 (only one of them is shown in FIG. 2) extending in the direction of row (right-and-left direction in the drawing) and a plurality of bit lines 56 (only one of them is shown in FIG. 2) extending in the direction of column (up-and-down direction in the drawing). The gate electrodes of transistors 60 of the memory cells 58 arranged in the direction of the same row are connected to the same word line 54, and the drain electrodes of transistors 60 of the memory cells 58 arranged in the direction of the same column are connected to the same bit line 56.

A plurality of word lines 54 are driven by a row decoder 64. A plurality of column selection lines for controlling column gates between the bit lines 56 and the data bus, are driven by a column decoder 66. The two decoders 64 and 66 are controlled by an input/output control circuit 68.

Reverting to FIG. 1, electrode terminals 27a and 27b are arranged on the front surface of the substrate 2 on the left in the drawing maintaining a predetermined gap (pitch) P. On the right of the electrode terminal 27b, there are arranged electrode terminals 27c and 27d in this order. The electrode terminals 27c and 27d are the ones that output chip selection signals for selecting a predetermined chip which is in operation out of a plurality of semiconductor chips 4, 5 and 6. The electrode terminals 27a and 27b are the ones that supply reference signals for producing comparison signals to be compared with the chip selection signals in a comparator circuit that will be described later, and are grounded. Namely, in this embodiment, the electrode terminals 27a and 27b supply the reference signals of ground potential to the semiconductor chips 4, 5 and 6.

On the right of the electrode terminal 27d, there are arranged a plurality of electrode terminals 27e to 27n in this order. Address signals in the banks, clock signals, clock enable signals, as well as various command signals and predetermined data signals used in other memory circuits are sent to the semiconductor chips 4, 5 and 6 from the electrode terminals 27e to 27n. The electrode terminal 27b and the electrode terminal 27c are arranged maintaining a gap of, for example 2P. The electrode terminals 27c to 27n are arranged maintaining, for example, a pitch P.

When the three semiconductor chips 4, 5 and 6 are laminated as in this embodiment, the terminal electrodes 27a, 27b of a number of two are sufficient for outputting reference signals. When more layers are laminated, the electrode terminals for reference signals may be provided in a number of "number of the layers–1". The number of the electrode terminals 27c, 27d for chip selection signals is the same as the number of the electrode terminals 27a, 27b for reference signals. Therefore, the number of the electrode terminals for chip selection signals must be increased by a number of increase of the electrode terminals for reference signals due to an increase in the number of the laminated layers of the semiconductor chips.

The semiconductor chip 4 according to the embodiment is laminated on the substrate 2. On the front surface of the semiconductor chip 4 (lower side in the diagramed embodiment), there are arranged electrode terminals 28a and 28b for reference signals on the left in the drawing maintaining a pitch P. On the right of the electrode terminal 28b, there are arranged electrode terminals (first electrode terminals) 28c and 28d for chip selection signals in this order. On the right of the electrode terminal 28d, there are arranged electrode terminals 28e to 28n in this order. The electrode terminals 28a to 28n are arranged so as to be opposed to the electrode terminals 27a to 27n of the substrate 2. The semiconductor chip 4 is stuck to the substrate 2 via a plurality of bumps 12a to 12n which are interchip connection members. Therefore, the electrode terminals 28a to 28n of the semiconductor chip 4 are electrically connected to the electrode terminals 27a to 27n of the substrate 2, respectively. Here, the electrode terminal 28a for reference signals is grounded via the bump 12a, and the electrode terminal 28b for reference signals is grounded via the bump 12b.

Electrode terminals 28a' to 28n' are arranged on the back surface of the semiconductor chip 4 (upper side in the drawing). The electrode terminals (second electrode terminals) 28a' and 28b' for reference signals are arranged being deviated toward the right in the drawing by one pitch with respect to the electrode terminals 28a and 28b for reference signals on the surface. Therefore, the electrode terminal 28a' is arranged on the back surface not being opposed to the electrode terminal 28a on the front surface but being opposed to the electrode terminal 28b which is deviated there from by one pitch. The electrode terminal 28a' is electrically connected to the electrode terminal 28a via a connection portion 8a. The electrode terminal 28b' is electrically connected to the electrode terminal 28b via a connection portion 8b. The connection portions 8a and 8b have connection conductors which are stepped in cross section to connect the electrode terminals 28a' and 28b' to the electrode terminals 28a and 28b which are arranged being deviated by one pitch.

The electrode terminal 28c' for chip selection signals is electrically connected to the electrode terminal 28c via a connection portion 9c, and the electrode terminal 28d' is electrically connected to the electrode terminal 28d via a connection portion 9d. Similarly, the electrode terminals 28e' to 28n' are electrically connected to the electrode terminals 28e to 28n via connection portions 9e to 9n, respectively. The connection portions 9c to 9n are constituted by via-holes formed in the surface of the semiconductor chip 4 penetrating therethrough almost perpendicularly thereto and connection conductors buried in the via-holes.

The semiconductor chip 5 laminated on the semiconductor chip 4 has a constitution same as that of the semiconductor chip 4. Electrode terminals 29a to 29n are arranged on the front surface of the semiconductor chip 5 in the same manner as the electrode terminals 28a to 28n on the surface of the semiconductor chip 4. On the back surface of the semiconductor chip 5, there are arranged electrode terminals 29a' to 29n' in the same manner as the electrode terminals 28a' to 28n' that are formed on the back surface of the semiconductor chip 4. The semiconductor chip 5 and the semiconductor chip 4 are stuck together via a plurality of bumps 13a to 13n. Accordingly, the electrode terminal 29b on the front surface of the semiconductor chip 5 is electrically connected to the electrode terminal 28a' on the back surface of the semiconductor chip 4 via a bump 13b. Similarly, the electrode terminals 29c to 29n on the front surface of the semiconductor chip 5 are electrically connected to the electrode terminals 28c' to 28n' on the back surface of the semiconductor chip 4 respectively via bumps 13c to 13n. Here, the electrode terminal 29a for reference signals on the front surface of the semiconductor chip 5 is connected to neither the electrode terminal 28a' nor the electrode terminal 28b' which are grounded. Therefore, the electrode terminal 29b for reference signals only is grounded via the bump 13b, connection portion 8a and bump 12a.

Further, the semiconductor chip 6 laminated on the semiconductor chip 5 has a constitution same as that of the semiconductor chips 4 and 5. Electrode terminals 30a to 30n are arranged on the front surface of the semiconductor chip 6 in the same manner as the electrodes 28a to 28n on the front surface of the semiconductor chip 4 and in the same manner as the electrode terminals 29a to 29n on the front surface of the semiconductor chip 5. On the back surface of the semiconductor chip 6, there are arranged electrode terminals 30a' to 30n' in the same manner as the electrode terminals 28a' to 28n' on the back surface of the semiconductor chip 4 and in the same manner as the electrode terminals 29a' to 29n' on the back surface of the semiconductor chip 5. The semiconductor chip 6 and the semiconductor chip 5 are stuck together via a plurality of bumps 14a to 14n. Accordingly, the electrode terminal 30b on the front surface of the semiconductor chip 6 is electrically connected to the electrode terminal 29a' on the back surface of the semiconductor chip 5. Similarly, the electrode terminals 30c to 30n on the front surface of the semiconductor chip 6 are electrically connected to the electrode terminals 29c' to 29n' on the back surface of the semiconductor chip 5, respectively. Here, the electrode terminals 30a and 30b for reference signals on the front surface of the semiconductor chip 6 are not connected to the electrode terminal 29b' which is grounded. Therefore, neither the electrode terminal 30a nor the electrode terminal 30b is grounded.

The electrode terminal 28b' on the back surface of the semiconductor chip 4 is a non-connection terminal; i.e., no electrode terminal that connects to the electrode terminal 28b' is arranged on the semiconductor chip 5 that is disposed being opposed thereto. Similarly, the electrode terminal 29b' on the back surface of the semiconductor chip 5, the electrode terminal 29a on the front surface of the semiconductor chip 5 and the electrode terminal 30a on the front surface of the semiconductor chip 6, are non-connection terminals having no opposing electrode terminals.

Figure 3:
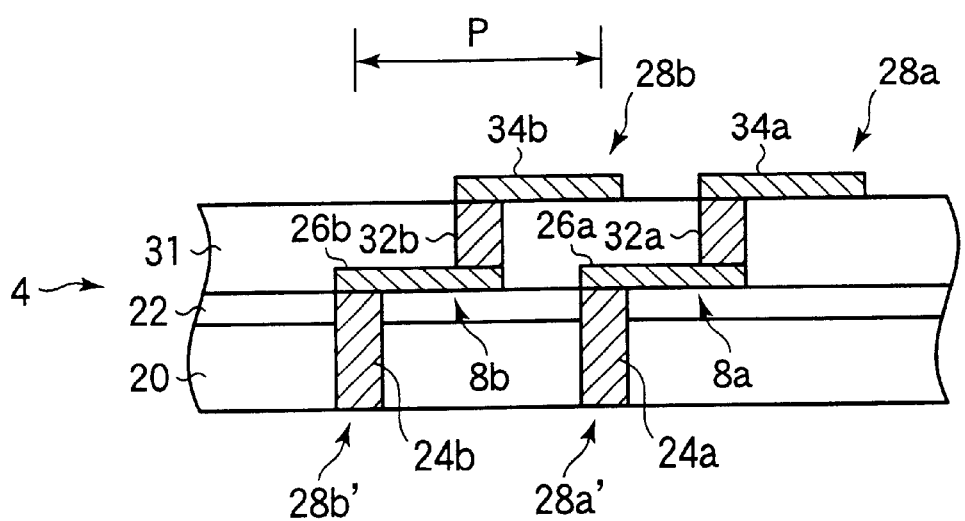
FIG. 3 is a sectional view illustrating the constitution of a portion of the semiconductor chip according to the first embodiment of the invention.

FIG. 3 is a sectional view illustrating a portion of the semiconductor chip 4 of FIG. 1 on an enlarged scale, and is turned upside down relative to the arrangement of the semiconductor chip 4 shown in FIG. 1. FIG. 3 illustrates the constitution of electrode terminals 28a, 28b, 28a', 28b' for reference signals and of the connection portions 8a and 8b as part of the semiconductor chip 4. As shown in FIG. 3, an insulating film 22 is formed on a silicon (Si) substrate 20 of, for example, the n-type. In the Si substrate 20 and in the insulating film 22, there are formed two via-holes 24a and 24b penetrating through the Si substrate 20 and the insulating film 22 maintaining a pitch P. A connection conductor such as of copper (Cu) is buried in the via-holes 24a and 24b. Of the connection conductor in the via-hole 24a, the exposed surface on the back surface side of the Si substrate 20 (lower side in the drawing) serves as the electrode terminal 28a'. Similarly, of the connection conductor in the via hole 24b, the exposed surface on the back surface side of the Si substrate 20 serves as the electrode terminal 28b'. The electrode terminals 28a' and 28b' may be provided with pads for connection to the bumps.

On the insulating film 22, there are formed wirings 26a and 26b of aluminum (Al), Cu or the like. The wiring 26a is electrically connected at its one end to the connection conductor in the via-hole 24a and is arranged at its other end being deviated toward the right in the drawing by a half pitch with respect to the electrode terminal 28a'. Similarly, the wiring 26b is electrically connected at its one end to the connection conductor in the via-hole 24b and is arranged at its other end being deviated toward the right in the drawing by a half pitch with respect to the electrode terminal 28b'. An insulating film 31 is formed on the whole surface of the wirings 26a and 26b. The insulating film 31 has a via-hole 32a which is opened therein at the other end of the wiring 26a and a via-hole 32b which is opened therein at the other end of the wiring 26b. Like in the via-holes 24a and 24b, connection conductors such as of Cu are buried in the via-holes 32a and 32b. The connection conductor in the via-hole 32a is electrically connected to the wiring 26a, and the connection conductor in the via-hole 32b is electrically connected to the wiring 26b.

Wirings 34a and 34b are formed on the front surface of the semiconductor chip 4 (upper side in the drawing) on the insulating film 31. The wiring 34a is electrically connected at its one end to the connection conductor in the via-hole 32a and is arranged at its other end being deviated toward the right in the drawing by one pitch with respect to the electrode terminal 28a'. Similarly, the wiring 34b is electrically connected at its one end to the connection conductor in the via-hole 32b and is arranged at its other end being deviated toward the right in the drawing by one pitch with respect to the electrode terminal 28b'. The other end of the wiring 34a serves as the electrode terminal 28a, and the other end of the wiring 34b serves as the electrode terminal 28b. The connection portion 8a is constituted by the connection conductors in the via-holes 24a, 32a and by the wirings 26a, 34a. Further, the connection portion 8b is constituted by the connection conductors in the via-holes 24b, 32b and by the wirings 26b, 34b. As will be described later with reference to FIG. 4, the connection portions 8a and 8b output comparison signals to the comparator circuit. FIG. 3, however, does not show the wirings for outputting the comparison signals.

Figure 4:
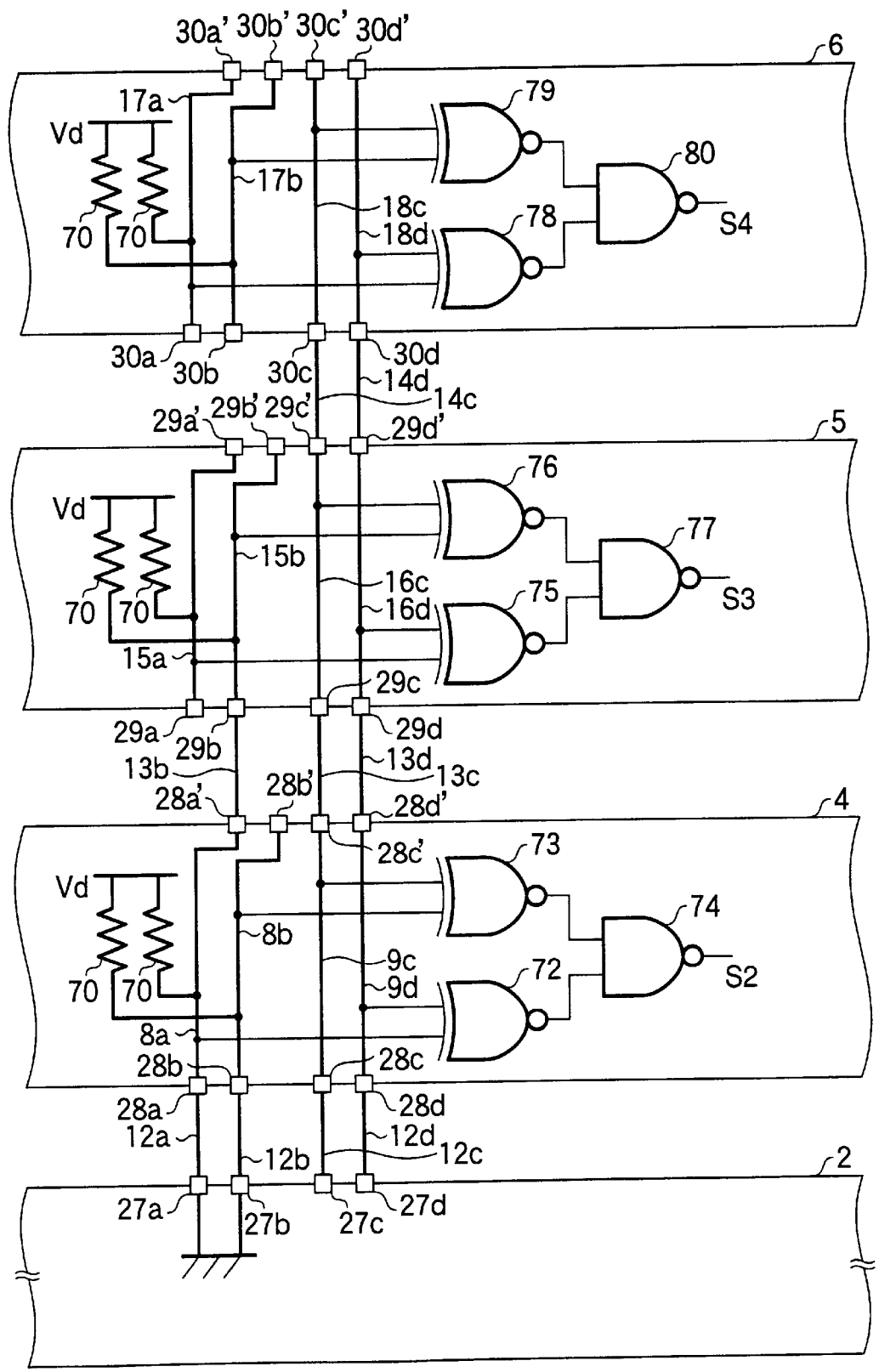
FIG. 4 is a sectional view schematically illustrating a logic circuit for selecting a semiconductor chip in a semiconductor integrated circuit device according to the first embodiment of the invention.

Next, the circuit constitution of the semiconductor integrated circuit device according to the embodiment will be described with reference to FIG. 4 which is a sectional view schematically illustrating the circuit constitution for selecting a semiconductor chip in the semiconductor integrated circuit device according to the embodiment. As shown in FIG. 4, the semiconductor chips 4, 5 and 6 are laminated in this order on the substrate 2. The electric connection from the substrate 2 to the semiconductor chips 4, 5 and 6 was described already with reference to FIG. 1, and is not repeated here but, instead, the circuit constitutions in the chips will be described. First, a chip selection signal S0 is output from the electrode terminal 27c for chip selection signals on the substrate 2, and a chip selection signal S1 is output from the electrode terminal 27d for chip selection signals.

The connection portions 8a and 8b of the semiconductor chip 4 are connected to a power source Vd, respectively, via pull-up resistors 70 formed in the chip. The connection portion 8a is grounded via the bump 12a and is maintained at a potential of a low (L) level. Therefore, the connection portion 8a outputs a comparison signal of the L-level. Similarly, the connection portion 8b is grounded via the bump 12b and is maintained at a potential of the low (L) level. Therefore, the connection portion 8b outputs a comparison signal of the L-level. Namely, the two comparison signals of the L-level are produced in the semiconductor chip 4.

A comparator circuit being constituted by two exclusive NOR (Ex-NOR) circuits 72, 73 and a NAND circuit 74 is formed in the semiconductor chip 4. The connection portion 8a is connected to one input terminal of the Ex-NOR circuit 72, and the connection portion 8b is connected to one input terminal of the Ex-NOR circuit 73. The connection portion 9c is connected to the other input terminal of the Ex-NOR circuit 73, and the connection portion 9d is connected to the other input terminal of the Ex-NOR circuit 72.

The output terminal of the Ex-NOR circuit 72 is connected to one input terminal of the NAND circuit 74, and the output terminal of the Ex-NOR circuit 73 is connected to the other input terminal of the NAND circuit 74. An output signal S2 is outputted from the NAND circuit 74. As the output signal S2 assumes the L-level, the semiconductor chip 4 works as an operation chip, and the memory circuit in the semiconductor chip 4 receives various commands and data via predetermined electrode terminals.

Like in the semiconductor chip 4, in the semiconductor chip 5 is formed a comparator circuit being constituted by two exclusive NOR (Ex-NOR) circuits 75, 76 and a NAND circuit 77 that receives the output signals from the two Ex-NOR circuits 75 and 76. An output signal S3 is outputted from the NAND circuit 77. As the output signal S3 assumes the L-level, the semiconductor chip 5 works as an operation chip, and the memory circuit in the semiconductor chip 5 receives various commands and data via predetermined electrode terminals.

The connection portion 15b of the semiconductor chip 5 is grounded via the connection portion 8a and is, hence, maintained at a potential of the L-level. Therefore, the connection portion 15b outputs a comparison signal of the L-level. On the other hand, the connection portion 15a has not been grounded and is, hence, maintained at a potential of the high (H) level due to the power source Vd connected via the pull-up resistors 70. Therefore, the connection portion 15a outputs a comparison signal of the H-level. That is, the semiconductor chip 5 produces a comparison signal of the L-level and a comparison signal of the H-level.

Like in the semiconductor chips 4 and 5, in the semiconductor chip 6 is formed a comparator circuit being constituted by two exclusive NOR (Ex-NOR) circuits 78, 79 and a NAND circuit 80 that receives the output signals from the two Ex-NOR circuits 78 and 79. The NAND circuit 80 outputs an output signal S4. As the output signal S4 assumes the L-level, the semiconductor chip 6 works as an operation chip, and the memory circuit in the semiconductor chip 6 receives various commands and data via predetermined electrode terminals.

The connection portions 17a and 17b of the semiconductor chip 6 are not grounded and are, hence, maintained at a potential of the H-level due to the power source Vd connected via the pull-up resistors 70. Therefore, the connection portions 17a and 17b output comparison signals of the H-level. That is, the semiconductor chip 6 produces comparison signals of the H-level only.

Next, described below is a method of selecting a semiconductor chip constituted as described above according to the embodiment. First, described below is a case where the chip selection signals S0 and S1 output from the electrode terminals 27c and 27d for chip selection signals of the substrate 2, both assume the L-level (0). A comparison signal of the L-level is input from the connection portion 8a to one input terminal of the Ex-NOR circuit 72 of the semiconductor chip 4, and a chip selection signal Si of the L-level is input from the connection portion 9d to the other input terminal. Therefore, the output signal of the Ex-NOR circuit 72 assumes the H-level. On the other hand, a comparison signal of the L-level is input from the connection portion 8b to one input terminal of the Ex-NOR circuit 73, and a chip selection signal S0 of the L-level is input from the connection portion 9c to the other input terminal. Therefore, the output signal of the Ex-NOR circuit 73 assumes the H-level. A signal of the H-level is input from the Ex-NOR circuit 72 to one input terminal of the NAND circuit 74, and a signal of the H-level is input from the Ex-NOR circuit 73 to the other input terminal. Therefore, the output signal S2 of the NAND circuit 74 assumes the L-level.

A comparison signal of the H-level is input from the connection portion 15a to one input terminal of the Ex-NOR circuit 75 in the semiconductor chip 5, and a chip selection signal S1 of the L-level is input from the connection portion 16d to the other input terminal. Therefore, the output signal of the Ex-NOR circuit 75 assumes the L-level. On the other hand, a comparison signal of the L-level is input from the connection portion 15b to one input terminal of the Ex-NOR circuit 76, and a chip selection signal S0 of the L-level is input from the connection portion 16c to the other input terminal. Therefore, the output signal of the Ex-NOR circuit 76 assumes the H-level. A signal of L-level is input from the Ex-NOR circuit 75 to one input terminal of the NAND circuit 77, and a signal of the H-level is input from the Ex-NOR circuit 76 to the other input terminal. Therefore, the output signal S3 of the NAND circuit 77 assumes the H-level.

A comparison signal of the H-level is input from the connection portion 17a to one input terminal of the Ex-NOR circuit 78 of the semiconductor chip 6, and a chip selection signal S1 of the L-level is input from the connection portion 18d to the other input terminal. Therefore, the output signal of the Ex-NOR circuit 78 assumes the L-level. On the other hand, a comparison signal of the H-level is input from the connection portion 17b to one input terminal of the Ex-NOR circuit 79, and a chip selection signal S0 of the L-level is input from the connection portion 18c to the other input terminal. Therefore, the output signal of the Ex-NOR circuit 79 assumes the L-level. A signal of the L-level is input from the Ex-NOR circuit 78 to one input terminal of the NAND circuit 80, and a signal of the L-level is input from the Ex-NOR circuit 79 to the other input terminal. Therefore, the output signal S4 of the NAND circuit 80 assumes the H-level. When the chip selection signals S0 and S1 both assume the L-level as described above, only the output signal S2 from the semiconductor chip 4 assumes the L-level, and the semiconductor chip 4 is selected as the operation chip.

Next, described below is a case where the chip selection signal S0 output from the electrode terminal 27c assumes the L-level, and the chip selection signal S1 output from the electrode terminal 27d assumes the H-level (1). A comparison signal of the L-level is input from the connection portion 8a to one input terminal of the Ex-NOR circuit 72 of the semiconductor chip 4, and a chip selection signal S1 of the H-level is input from the connection portion 9d to the other input terminal. Therefore, the output signal of the Ex-NOR circuit 72 assumes the L-level. On the other hand, a comparison signal of the L-level is input from the connection portion 8b to one input terminal of the Ex-NOR circuit 73, and a chip selection signal S0 of the L-level is input from the connection portion 9c to the other input terminal. Therefore, the output signal of the Ex-NOR circuit 73 assumes the H-level. A signal of the L-level is input from the Ex-NOR circuit 72 to one input terminal of the NAND circuit 74, and a signal of the H-level is input from the Ex-NOR circuit 73 to the other input terminal. Therefore, the output signal S2 of the NAND circuit 74 assumes the H-level.

A comparison signal of the H-level is input from the connection portion 15a to one input terminal of the Ex-NOR circuit 75 of the semiconductor chip 5, and a chip selection signal S1 of the H-level is input from the connection portion 16d to the other input terminal. Therefore, the output signal of the Ex-NOR circuit 75 assumes the H-level. On the other hand, a comparison signal of the L-level is input from the connection portion 15b to one input terminal of the Ex-NOR circuit 76, and a chip selection signal S0 of the L-level is input from the connection portion 16c to the other input terminal. Therefore, the output signal of the Ex-NOR circuit 76 assumes the H-level. A signal of the H-level is input from the Ex-NOR circuit 75 to one input terminal of the NAND circuit 77, and a signal of the H-level is input from the Ex-NOR circuit 76 to the other input terminal. Therefore, the output signal S3 of the NAND circuit 77 assumes the L-level.

A comparison signal of the H-level is input from the connection portion 17a to one input terminal of the Ex-NOR circuit 78 of the semiconductor chip 6, and a chip selection signal S1 of the H-level is input from the connection portion 18d to the other input terminal. Therefore, the output signal of the Ex-NOR circuit 78 assumes the H-level. On the other hand, a comparison signal of the H-level is input from the connection portion 17b to one input terminal of the Ex-NOR circuit 79, and a chip selection signal S0 of the L-level is input from the connection portion 18c to the other input terminal. Therefore, the output signal of the Ex-NOR circuit 79 assumes the L-level. A signal of the H-level is input from the Ex-NOR circuit 78 to one input terminal of the NAND circuit 80, and a signal of the L-level is input from the Ex-NOR circuit 79 to the other input terminal. Therefore, the output signal S4 of the NAND circuit 80 assumes the H-level. When the chip selection signal S0 assumes the L-level and the chip selection signal S1 assumes the H-level as described above, only the output signal S3 from the semiconductor chip 5 assumes the L-level, and the semiconductor chip 5 is selected as an operation chip.

Next, described below is a case where the chip selection signals S0 and S1 output from the electrode terminals 27c and 27d both assume the H-level. A comparison signal of the L-level is input from the connection portion 8a to one input terminal of the Ex-NOR circuit 72 of the semiconductor chip 4, and a chip selection signal S1 of the H-level is input from the connection portion 9d to the other input terminal. Therefore, the output signal of the Ex-NOR circuit 72 assumes the L-level. On the other hand, a comparison signal of the L-level is input from the connection portion 8b to one input terminal of the Ex-NOR circuit 73, and a chip selection signal S0 of the H-level is input from the connection portion 9c to the other input terminal. Therefore, the output signal of the Ex-NOR circuit 73 assumes the L-level. A signal of the L-level is input from the Ex-NOR circuit 72 to one input terminal of the NAND circuit 74, and a signal of the L-level is input from the Ex-NOR circuit 73 to the other input terminal. Therefore, the output signal S2 of the NAND circuit 74 assumes the H-level.

A comparison signal of the H-level is input from the connection portion 15a to one input terminal of the Ex-NOR circuit 75 of the semiconductor chip 5, and a chip selection signal S1 of the H-level is input from the connection portion 16d to the other input terminal. Therefore, the output signal of the Ex-NOR circuit 75 assumes the H-level. On the other hand, a comparison signal of the L-level is input from the connection portion 15b to one input terminal of the Ex-NOR circuit 76, and a chip select ion signal S0 of the H-level is input from the connection portion 16c to the other input terminal. Therefore, the output signal of the Ex-NOR circuit 76 assumes the L-level. A signal of the H-level is input from the Ex-NOR circuit 75 to one input terminal of the NAND circuit 77, and a signal of the L-level is input from the Ex-NOR circuit 76 to the other input terminal. Therefore, the output signal S3 of the NAND circuit 77 assumes the H-level.

A comparison signal of the H-level is input from the connection portion 17a to one input terminal of the Ex-NOR circuit 78 of the semiconductor chip 6, and a chip selection signal S1 of the H-level is input from the connection portion 18d to the other input terminal. Therefore, the output signal of the Ex-NOR circuit 78 assumes the H-level. On the other hand, a comparison signal of the H-level is input from the connection portion 17b to one input terminal of the Ex-NOR circuit 79, and a chip selection signal S0 of the H-level is input from the connection portion 18c to the other input terminal. Therefore, the output signal of the Ex-NOR circuit 79 assumes the H-level. A signal of the H-level is input from the Ex-NOR circuit 78 to one input terminal of the NAND circuit 80, and a signal of the H-level is input from the Ex-NOR circuit 79 to the other input terminal. Therefore, the output signal S4 of the NAND circuit 80 assumes the L-level. When the chip selection signals S0 and S1 both assume the H-level as described above, only the output signal S4 from the semiconductor chip 6 assumes the L-level, and the semiconductor chip 6 is selected as an operation chip.

The above operations are tabulated in the following Tables 1 to 3 which show output signals S2, S3 and S4 outputted based on the chip selection signals S0 and S1. Table 1 shows output signals S2 from the semiconductor chip 4, Table 2 shows output signals S3 from the semiconductor chip 5, and Table 3 shows output signals S4 from the semiconductor chip 6.

TABLE 1

| S0 | S1 | S2 | |
|---|---|---|---|
| L | L | L | SELECTION |
| L | H | H | |
| H | L | H | |
| H | H | H | |

TABLE 2

| S0 | S1 | S3 | |
|---|---|---|---|
| L | L | H | |
| L | H | L | SELECTION |
| H | L | H | |
| H | H | H | |

TABLE 3

| S0 | S1 | S4 | |
|---|---|---|---|
| L | L | H | |
| L | H | H | |
| H | L | H | |
| H | H | L | SELECTION |

In this embodiment, the numbers of electrode terminals electrically connected to the electrode terminals 27a and 27b for reference signals of the substrate 2 are different depending upon the semiconductor chips 4, 5 and 6. Therefore, the semiconductor chips 4, 5 and 6 are supplied with reference signals of different combinations and, hence, produce different comparison signals despite of being supplied with common chip selection signals. Therefore, despite the plurality of semiconductor chips 4, 5 and 6 forming the same wiring pattern are laminated, any one of the semiconductor chips 4, 5 and 6 that is desired is selected as an operation chip by comparing the chip selection signals with the comparison signals in a predetermined comparator circuit.

Figure 5:
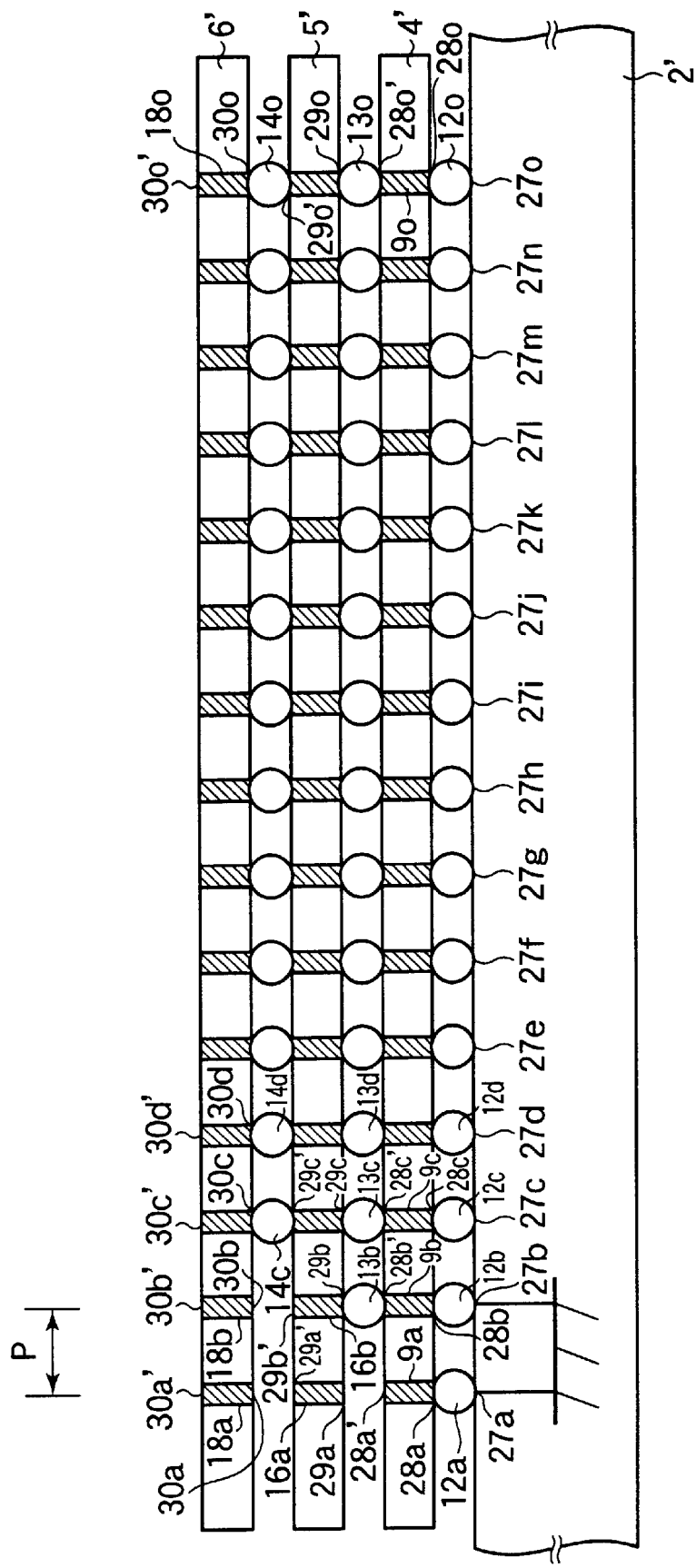
FIG. 5 is a sectional view illustrating the constitution of the semiconductor integrated circuit device according to a second embodiment of the invention.

Next, the semiconductor integrated circuit device according to a second embodiment of the invention will be described with reference to FIG. 5. FIG. 5 is a sectional view illustrating the constitution of the semiconductor integrated circuit device according to this embodiment. Referring to FIG. 5, a plurality of electrode terminals 27a to 27o are arranged on the front surface of a substrate 2' maintaining a predetermined pitch P. The electrode terminals (third electrode terminals) 27a and 27b for reference signals are grounded. Chip selection signals are outputted from the electrode terminals 27c and 27d for chip selection signals. The electrode terminals 27e to 27o output, to the semiconductor chips 4', 5' and 6', address signals in the banks, clock signals, clock enable signals, as well as command signals used in other memory circuits and predetermined data signals.

Electrode terminals (fourth electrode terminals) 28a and 28b for reference signals are arranged on the front surface of the semiconductor chip 4' (lower side in the drawing) on the substrate 2' so as to be opposed to the electrode terminals 27a and 27b. Similarly, electrode terminals 28c to 28o are arranged so as to be opposed to the electrode terminals 27c to 27n. The substrate 2' and the semiconductor chip 4' are stuck together via a plurality of bumps 12a to 12o. Therefore, the electrode terminals 27a to 27o of the substrate 2' are electrically connected to the electrode terminals 28a to 28o of the semiconductor chip 4', respectively. In this case, the electrode terminal 28a for reference signals of the semiconductor chip 4' is grounded via the bump 12a, and the electrode terminal 28b is grounded via the bump 12b.

Electrode terminals 28a' to 28o' are arranged on the back surface of the semiconductor chip 4' (upper side in the drawing). The electrode terminal 28a' for reference signals is electrically connected to the electrode terminal 28a on the front surface via a connection portion 9a. The electrode terminal 28b' is electrically connected to the electrode terminal 28b on the front surface via a connection portion 9b. Similarly, the electrode terminals 28c to 28o are electrically connected to the electrode terminals 28c' to 28o' respectively via connection portions 9c to 9o. The connection portions 9a to 9o are constituted by via-holes formed in the surface of the semiconductor chip 4' penetrating therethrough almost perpendicularly thereto and connection conductors buried in the via-holes.

The semiconductor chip 5' laminated on the semiconductor chip 4' has a constitution same as that of the semiconductor chip 4'. Electrode terminals 29a to 29o are arranged on the surface of the semiconductor chip 5'. On the back surface of the semiconductor chip 5', there are arranged electrode terminals 29a' to 29o'. The electrode terminal (fourth electrode terminal) 29a on the front surface of the semiconductor chip 5' is electrically connected to the electrode terminal 29a' for reference signals on the back surface of the semiconductor chip 5' via the connection portion 16a. The electrode terminal (fourth electrode terminal) 29b on the front surface of the semiconductor chip 5' is electrically connected to the electrode terminal 29b' for reference signals on the back surface of the semiconductor chip 5' via the connection portion 16b. Similarly, the electrode terminals 29c to 29o on the front surface of the semiconductor chip 5' are electrically connected to the electrode terminals 29c' to 29o' on the back surface of the semiconductor chip 5' respectively via connection portions 16c to 16o.

The semiconductor chip 5' and the semiconductor chip 4' are stuck together via a plurality of bumps 13b to 13o. Accordingly, the electrode terminals 29b to 29o on the front surface of the semiconductor chip 5' are electrically connected to the electrode terminals 28b' to 28o ' on the back surface of the semiconductor chip 4', respectively. Here, there are formed no bumps 13b to 13o between the electrode terminal 29a and the electrode terminal 28a' for reference signals and, hence, the electrode terminal 29a is not connected to the electrode terminal 28a' that is grounded. Accordingly, only the electrode terminal 29b for reference signals is grounded via the bump 13b, connection portion 9b and bump 12b.

The semiconductor chip 6' arranged on the semiconductor chip 5' has a constitution same as that of the semiconductor chips 4' and 5'. Electrode terminals 30a to 30o are arranged on the surface of the semiconductor chip 6'. On the back surface of the semiconductor chip 6', there are arranged electrode terminals 30a' to 30o'. The electrode terminal (fourth electrode terminal) 30a on the front surface of the semiconductor chip 6' is electrically connected to the electrode terminal 30a' for reference signals on the back surface of the semiconductor chip 6' via the connection portion 18a. The electrode terminal (fourth electrode terminal) 30b on the front surface of the semiconductor chip 6' is electrically connected to the electrode terminal 30b' for reference signals on the back surface of the semiconductor chip 6' via the connection portion 16b. Similarly, the electrode terminals 30c to 30o on the front surface of the semiconductor chip 6' are electrically connected to the electrode terminals 30c' to 30o' on the back surface of the semiconductor chip 6' respectively via connection portions 16c to 16o.

The semiconductor chip 6' and the semiconductor chip 5' are stuck together via a plurality of bumps 14c to 14o. Accordingly, the electrode terminals 30c to 30O on the front surface of the semiconductor chip 6' are electrically connected to the electrode terminals 29c' to 29o' on the back surface of the semiconductor chip 5', respectively. Here, there are formed no bumps 14c to 14o between the electrode terminal 30a and the electrode terminal 29a' for reference signals. Similarly, there are formed no bumps 14c to 14o between the electrode terminal 30b and the electrode terminal 29b' for reference signals. Hence, the electrode terminals 30a and 30b for reference signals are not connected to the electrode terminal 29b' that is grounded of the semiconductor chip 5'. Accordingly, both the electrode terminals 30a and 30b are not grounded.

In the electric connection among the substrate 2' and the semiconductor chips 4', 5' and 6', a comparator circuit similar to that of the circuit constitution shown in FIG. 4 and described with reference to the first embodiment, is formed in the semiconductor chips 4', 5' and 6', and any one of the semiconductor chips 4', 5' and 6' is selected as an operation chip by the method of selecting the semiconductor chip same as that of the first embodiment.

In this embodiment, the bumps 12a, 12b and 13b are so arranged that the number of connection terminals of the semiconductor chips 4', 5' and 6' decreases one by one in the direction of lamination (toward the upper side), the connec tion terminals being electrically connected to the electrode terminals 27a and 27b for reference signals of the substrate 2'. Therefore, the semiconductor chips 4', 5' and 6' are supplied with reference signals of different combinations for forming reference signals and, hence, produce different comparison signals despite of being supplied with common chip selection signals. Therefore, despite the semiconductor chips 4', 5' and 6' forming the same wiring pattern are laminated, any one of the semiconductor chips 4', 5' and 6' that is desired is selected as an operation chip by comparing the chip selection signals with the comparison signals in the predetermined comparator circuit.

This invention can be modified in a variety of ways not being limited to the above embodiments only.

In the above embodiments, the substrate and the semiconductor chip or two semiconductor chips are stuck together by using a plurality of bumps. Not being limited thereto only, however, they according to the invention may be stuck together by using any other interchip connection member such as an ACF (anisotropic conductive film).

In the above embodiments, further, the comparator circuit is constituted by two Ex-NOR circuits and the NAND circuit that receives output signals from the two Ex-NOR circuits. Not being limited thereto only, however, the comparator circuit may be constituted by any other circuit including Ex-OR circuits, as a matter of course.

Further, though the above embodiments have dealt with the semiconductor chips forming a memory circuit and with the semiconductor integrated circuit device using these semiconductor chips, the invention can be further applied to the semiconductor chips forming a CPU or a system LSI and to the semiconductor integrated circuit using such semiconductor chips.

According to the present invention as described above, a predetermined chip can be selected by chip selection signals sent from an external unit even when the chips having the same wiring pattern are laminated one upon the other in a plurality of numbers.

What is claimed is:

1. A semiconductor chip comprising:

a plurality of first electrode terminals arranged on a front surface maintaining a predetermined pitch to receive reference signals for producing comparison signals that are to be compared with chip selection signals in a comparator circuit to select a chip;

a plurality of second electrode terminals arranged on a back surface opposed to the front surface each being deviated by one pitch from the plurality of the first electrode terminals to output the reference signals input to the first electrode terminals; and connection portions having a stepped shape in between the front and back surfaces for electrically connecting the first and second electrode terminals that are deviated by one pitch.

2. A semiconductor chip according to claim 1, further comprising electrode terminals for receiving chip selection signals, the electrode terminals for receiving chip selection signals being formed in a number same as the number of the first electrode terminals.

3. A semiconductor chip according to claim 1, further comprising electrode terminals for receiving chip selection signals, the electrode terminals for receiving chip selection signals being formed in a number same as the number of the first electrode terminals.

4. A semiconductor integrated circuit device comprising a plurality of semiconductor chips having the same wiring pattern and being laminated on a substrate, and interchip connection members for electrically connecting the electrode terminals that are arranged being opposed to each other as a result of sticking the substrate and the plurality of semiconductor chips together, the semiconductor chips being those of any one of claim 1, 2, or 3.

5. A semiconductor integrated circuit device according to claim 4, wherein the interchip connection members are bumps.

* * * * *